United States Patent
Li

(10) Patent No.: US 10,505,114 B2
(45) Date of Patent: Dec. 10, 2019

(54) ALIGNMENT MARK STRUCTURE, MASK, SUBSTRATE AND ALIGNMENT METHOD

(71) Applicants: BOE Technology Group Co., Ltd., Beijing (CN); Ordos Yuansheng Optoelectronics Co., Ltd., Inner Mongolia (CN)

(72) Inventor: Dongwei Li, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 188 days.

(21) Appl. No.: 15/233,046

(22) Filed: Aug. 10, 2016

(65) Prior Publication Data

US 2017/0194563 A1 Jul. 6, 2017

(30) Foreign Application Priority Data

Jan. 5, 2016 (CN) .......................... 2016 1 0006052

(51) Int. Cl.
*H01L 51/00* (2006.01)
*C23C 14/22* (2006.01)
(Continued)

(52) U.S. Cl.
CPC ........ *H01L 51/0011* (2013.01); *C23C 14/042* (2013.01); *C23C 14/22* (2013.01);
(Continued)

(58) Field of Classification Search
CPC ............. H01L 51/0011; H01L 51/0012; H01L 51/5012; C23C 14/22
See application file for complete search history.

(56) References Cited

U.S. PATENT DOCUMENTS 6,749,690 B2* 6/2004 Clark .................... C23C 14/042
118/504
7,964,421 B2* 6/2011 Moriyama ............ C23C 14/042
438/22

FOREIGN PATENT DOCUMENTS

CN 103995433 A 8/2014
CN 104122700 A 10/2014
(Continued)

OTHER PUBLICATIONS

First Office Action, including Search Report, for Chinese Patent Application No. 201610006052.9, dated Apr. 25, 2019, 20 pages.

*Primary Examiner* — Rick K Chang
(74) *Attorney, Agent, or Firm* — Westman, Champlin & Koehler, P.A.

(57) ABSTRACT

The present disclosure discloses an alignment mark structure, a mask, a substrate and an alignment method for the mask and the substrate. The alignment mark structure includes: at least two first alignment marks and at least two second alignment marks provided on the mask, a pattern size of the first alignment marks being larger than that of the second alignment marks; at least two third alignment marks and at least two fourth alignment marks provided on the substrate, wherein the number and the location of the third alignment marks correspond to the number and the location of the first alignment marks, respectively, and the number and the location of the fourth alignment marks correspond to the number and the location of the second alignment marks, respectively.

18 Claims, 5 Drawing Sheets

(51) Int. Cl.
*C23C 14/04* (2006.01)
*H01L 51/50* (2006.01)

(52) U.S. Cl.
CPC .......... *H01L 51/00* (2013.01); *H01L 51/0012* (2013.01); *H01L 51/5012* (2013.01)

(56) References Cited

FOREIGN PATENT DOCUMENTS

| | | |
|---|---|---|
| CN | 104810312 A | 7/2015 |
| EP | 2 282 338 A2 | 2/2011 |

* cited by examiner ive sync technology in the art following LCD display since it is thin, self-luminous and has many advantages of fast response, wide viewing angle, rich colors, high brightness, low power consumption, resistance to high temperature and low temperature, etc. OLED display may be widely used in smart phones, tablet computers, televisions and other end products. -->

ALIGNMENT MARK STRUCTURE, MASK, SUBSTRATE AND ALIGNMENT METHOD

CROSS-REFERENCE TO RELATED APPLICATION

This application claims the benefit of the Chinese Patent Application No. 201610006052.9 filed on Jan. 5, 2016 in the State Intellectual Property Office of China, entitled with "Alignment Mark Structure, Mask, Substrate and Alignment Method", the whole disclosure of which is incorporated herein by reference.

BACKGROUND OF DISCLOSURE

The present disclosure relates to a field of liquid crystal display, and more particularly relates to an alignment mark structure, a mask, a substrate and an alignment method for the mask and the substrate.

A flat panel display includes a variety of displays, such as a Liquid Crystal Display (LCD), an Organic Light-Emitting Diode (OLED) display, a Plasma Display Panel (PDP) display and an electronic ink display. OLED display is considered to be a third-generation display technology in the art following LCD display since it is thin, self-luminous and has many advantages of fast response, wide viewing angle, rich colors, high brightness, low power consumption, resistance to high temperature and low temperature, etc. OLED display may be widely used in smart phones, tablet computers, televisions and other end products.

However, the LCD display recently has a resolution up to 400 or more pixels/inch (pixels per inch, ppi), even with a future development trend of exceeding more than 500 ppi. To improve the display resolution, it may be necessary to accordingly reduce the pixel pattern, which raises a large challenge to the present OLED production technology. Because the existing mature OLED production technology employs orderly vapor deposition of red, green and blue organic light emitting materials on a substrate by use of a fine metal mask to prepare a color pixel pattern, the pixel pattern can be precisely deposited on a back plate only by precisely aligning the mask with the substrate firstly when the vapor deposition is performed.

At present, the alignment of the mask with the substrate cannot meet the requirements for directly vapor depositing pixel pattern. It is usually necessary to determine a deviation value between the mask and the substrate by an experimental vapor deposition, to set a compensation value according to the deviation value, and to readjust the mask, and then the vapor deposition can be carried out. Even it is so, it often occurs that the compensation value is incorrectly set or the precision of the device cannot achieve a desirable effect, which can easily cause damages and results in a complex production process of OLED display device and time consumption.

SUMMARY

An embodiment of the invention provides an alignment mark structure used in a mask and a substrate, the mask having a patterned region and a non-patterned region surrounding the patterned region, the alignment mark structure including:

at least two first alignment marks and at least two second alignment marks provided on the mask, a pattern size of the first alignment marks being larger than that of the second alignment marks;

at least two third alignment marks and at least two fourth alignment marks provided on the substrate, wherein the number and the location of the third alignment marks correspond to the number and the location of the first alignment marks, respectively, and the number and the location of the fourth alignment marks correspond to the number and the location of the second alignment marks, respectively.

In this embodiment, the alignment mark structure includes the first alignment marks and the second alignment marks that are different in pattern size as well as the third alignment marks corresponding to the first alignment marks and the fourth alignment marks corresponding to the second alignment marks. When the mask and the substrate are aligned, the first alignment marks with larger pattern size can be firstly aligned with the third alignment marks corresponding thereto to achieve an initial alignment. On the basis of the initial alignment, the second alignment marks with smaller pattern size are then aligned with the fourth alignment marks corresponding thereto to achieve a precise alignment of the mask with the substrate. The efficiency of precise alignment is improved and the pixel vapor deposition process of OLED display device is simplified.

Preferably, the first alignment marks are provided in a region of the non-patterned region away from the patterned region, and the second alignment marks are provided in a region of the non-patterned region adjacent to the patterned region.

Preferably, there are four first alignment marks and four second alignment marks; and symmetrical axes of a rectangle formed by successively connecting the four first alignment marks coincide with symmetrical axes of the mask and symmetrical axes of a rectangle formed by successively connecting the four second alignment marks coincide with symmetrical axes of the mask.

Preferably, diagonal lines of the rectangle formed by successively connecting the four first alignment marks coincide with diagonal lines of the mask.

Preferably, the pattern size of the first alignment marks is larger than or equal to that of the third alignment marks.

Preferably, a maximum width of pattern of the first alignment marks is less than or equal to 0.5 mm, and a maximum width of pattern of the third alignment marks is less than or equal to 0.3 mm.

Preferably, the pattern size of the second alignment marks is larger than or equal to that of the fourth alignment marks.

Preferably, a maximum width of pattern of the second alignment marks is less than or equal to 2 times of width of the pixel pattern in the patterned region, and a maximum width of pattern of the fourth alignment marks is less than or equal to 1.5 times of width of the pixel pattern in the patterned region.

Preferably, the pattern size of the third alignment marks is larger than that of the fourth alignment marks.

Preferably, the pattern of the third alignment marks and the pattern of the fourth alignment marks are different from each other.

Based on the same inventive concept, an embodiment of the present invention provides a mask having a patterned region and a non-patterned region surrounding the patterned region, at least two first alignment marks and at least two second alignment marks being provided on the mask, a pattern size of the first alignment marks being larger than that of the second alignment marks;

wherein the first alignment marks are configured to be firstly aligned with third alignment marks provided on a substrate, and the number and the location of the first alignment marks correspond to the number and the location of the third alignment marks, respectively; and wherein the second alignment marks are configured to be secondly aligned with fourth alignment marks provided on the substrate, and the number and the location of the second alignment marks correspond to the number and the location of the fourth alignment marks, respectively.

Based on the same inventive concept, an embodiment of the present invention provides a substrate configured to be aligned with the above mask, at least two third alignment marks and at least two fourth alignment marks being provided on the substrate, the number and the location of the third alignment marks corresponding to the number and the location of the first alignment marks, respectively, and the number and the location of the fourth alignment marks corresponding to the number and the location of the second alignment marks, respectively.

An embodiment of the present invention provides an alignment method for a mask and a substrate using the above alignment mark structure, the method including the steps of:

correspondingly aligning the respective first alignment marks provided on the mask with the respective third alignment marks provided on the substrate, respectively, by means of low power image sensors to achieve a first alignment of the mask with the substrate, and correspondingly aligning the respective second alignment marks provided on the mask with the respective fourth alignment marks provided on the substrate, respectively, by means of high power image sensors to achieve a second alignment of the mask with the substrate.

The embodiments of the present invention have the following beneficial effects:

DETAILED DESCRIPTION OF EMBODIMENTS

Figure 1:
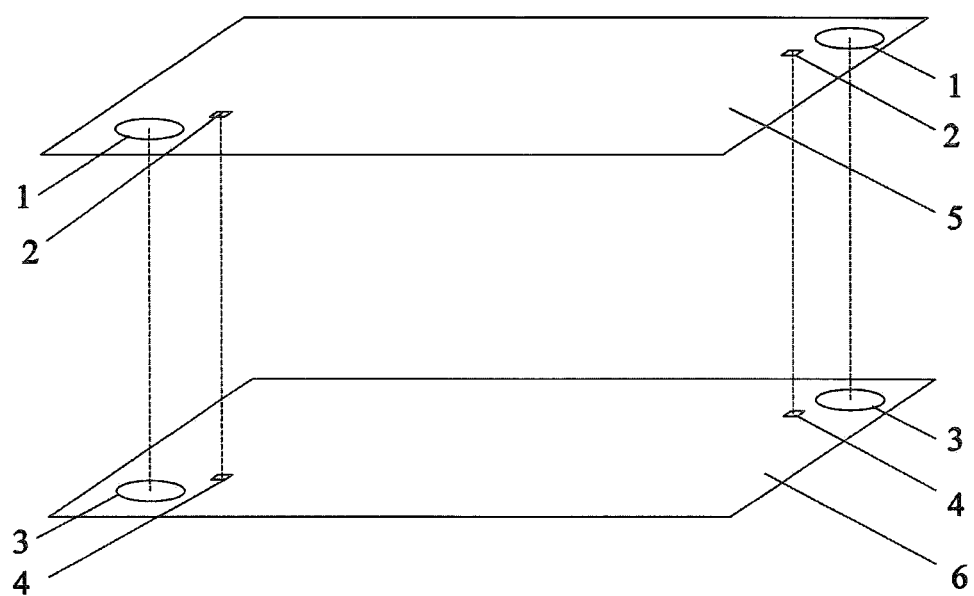
FIG. 1 is a schematic view of an alignment mark structure provided on a mask and a substrate according to an embodiment of the invention.

Embodiments of the present invention will be described in detail in the following with reference to the accompanying drawings. It should be noted that the same or similar reference numerals denote the same or similar elements or elements with same or similar functions in the context. The embodiments described below with reference to the accompanying drawings are exemplary, only serve to explain the disclosure and cannot be construed as a limit to the present disclosure.

One object of the present disclosure is to provide an alignment mark structure, mask, a substrate and an alignment method for the mask and the substrate, which enables a direct and fast precise alignment of the mask and the substrate, avoids the requirements in the prior art for repeated measurements and adjustments which enable the mask and the substrate to be precisely aligned, improves the efficiency of precise alignment and simplifies the pixel vapor deposition process of OLED display device.

An embodiment of the present invention provides an alignment mark structure, the alignment mark structure including:

at least two first alignment marks and at least two second alignment marks provided on a mask, a pattern size of the first alignment marks being larger than that of the second alignment marks;

at least two third alignment marks and at least two fourth alignment marks provided on a substrate, the number and the location of the third alignment marks corresponding to the number and the location of the first alignment marks, respectively, the number and the location of the fourth alignment marks corresponding to the number and the location of the second alignment marks, respectively.

The alignment mark structure according to the embodiment of the present invention is used in a mask and a substrate so that the mask and the substrate are aligned with each other in high precision.

In specific embodiments, two, three, four or more first alignment marks may be provided on the mask, two, three, four or more second alignment marks may be provided on the mask, and the third alignment marks and the fourth alignment marks are provided on the substrate. The number of the third alignment marks is equal to the number of the first alignment marks. The number of the fourth alignment marks is equal to the number of the second alignment marks. Specifically, the plurality of first alignment marks may have same pattern shape or different pattern shapes, and the plurality of second alignment marks may have same pattern shape or different pattern shapes. The first alignment marks and the second alignment marks may have same pattern shape or different pattern shapes from each other.

Referring to FIG. 1, there is provided an alignment mark structure will be specifically described hereinafter.

The alignment mark structure includes: two circular first alignment marks 1 and two rectangular second alignment marks 2 provided on a mask 5; and two circular third alignment marks 3 and two rectangular fourth alignment marks 4 provided on a substrate 6. A pattern size of the first alignment marks 1 is larger than a pattern size of the second alignment marks 2. The number and the location of the third alignment marks 3 correspond to the number and the location of the first alignment marks 1, respectively, and the number and the location of the fourth alignment marks 4 correspond to the number and the location of the second alignment marks 2, respectively.

In this embodiment, the alignment mark structure includes the first alignment marks 1 and the second alignment marks 2 that are different in pattern size as well as the third alignment marks 3 corresponding to the first alignment marks 1 and the fourth alignment marks 4 corresponding to the second alignment marks 2. When the mask 5 and the substrate 6 are aligned with each other, the first alignment marks 1 with larger pattern size can be firstly aligned with the third alignment marks 3 corresponding thereto to achieve an initial alignment. On the basis of the initial alignment, the second alignment marks 2 with smaller pattern size are then aligned with the fourth alignment marks 4 corresponding thereto to achieve a precise alignment of the mask 5 with the substrate 6. Therefore, the mask 5 can be aligned with the substrate 6 in a short time and in a fast and precise manner. The efficiency of precise alignment is improved and the pixel vapor deposition process of OLED display device is simplified.

In the above-described embodiment, the alignment mark structure includes two first alignment marks 1 and two second alignment marks 2, which is taken as an example to be described in detail in which the least amount of the alignment marks is necessary on the basis of meeting the requirements of the precise alignment of the mask 5 with the substrate 6. When the alignment marks are specifically provided, the alignment mark structure may include a plurality of first alignment marks 1 and a plurality of second alignment marks 2, the number of the third alignment marks 3 is the same as that of the first alignment marks 1, the number of the fourth alignment marks 4 is the same as that of the second alignment marks 2.

Specifically, the number of first alignment marks and the number of the second alignment marks may be the same or may be different from each other, which will not be limited herein.

It should be noted that, in the above-described embodiment, the first and third alignment marks that are circular as well as the second and fourth alignment marks that are rectangular is illustrated as an example. In particular embodiments, the first and third alignment marks may also be square, rectangular, triangular, cross-shaped or any other patterns that can be used as an alignment mark, and the second and fourth alignment marks may also be circular, square, triangular, cross-shaped or any other patterns that can be used as alignment marks, which will not be limited herein. The first alignment marks and the second alignment marks may have same pattern shape or different pattern shapes from each other, and the third alignment marks and the fourth alignment marks may have same pattern shape or different pattern shapes from each other. The first alignment marks and the second alignment marks that have different pattern shapes from each other may be easier to be identified, and the third alignment marks and the fourth alignment marks that have different pattern shapes from each other may be easier to be identified. In another embodiment, the first alignment marks and the third alignment marks may have same pattern shape or different pattern shapes from each other. The first alignment marks and the third alignment marks that have different pattern shapes from each other may be easier to be identified. The second alignment marks and the fourth alignment marks may have same pattern shape or different pattern shapes from each other, and the second alignment marks and the fourth alignment marks that have different pattern shapes from each other may be easier to be identified. It should be noted that at least one of the shape and the size of the first and third alignment marks is different from each other and at least one of the shape and the size of the second and fourth alignment marks is different from each other.

Figure 2:
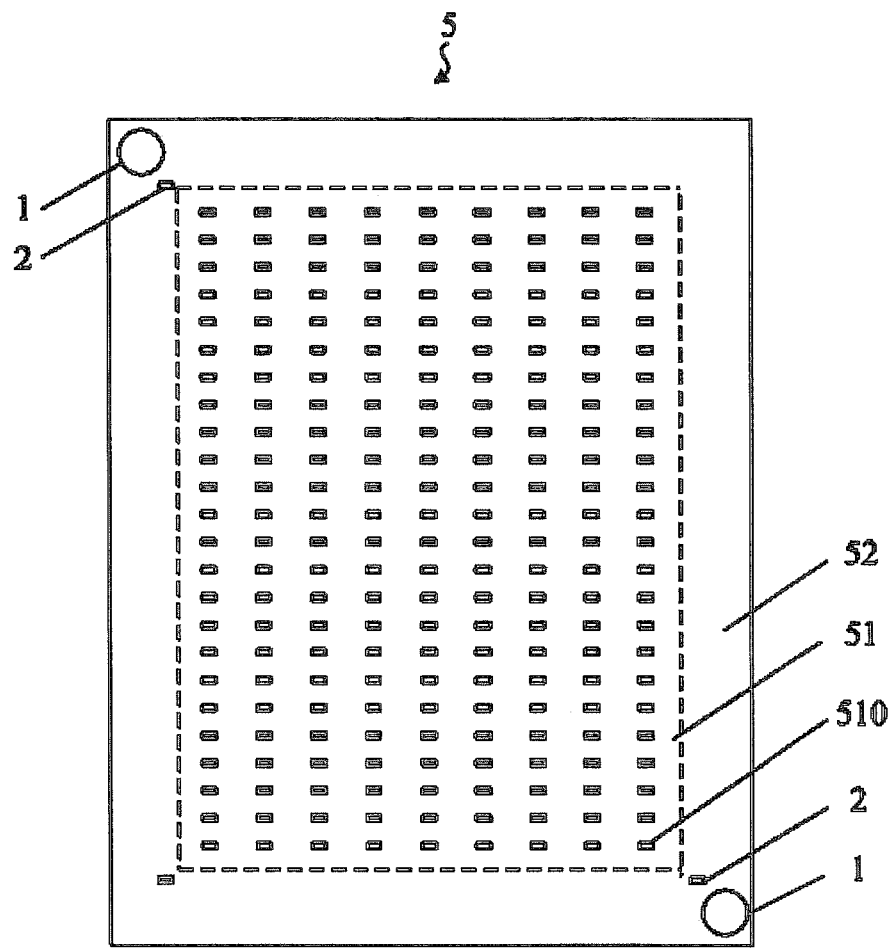
FIG. 2 is a top schematic view of the mask according to the embodiment of the invention.

Generally, for a mask with a deposited pixel pattern, in addition to the alignment marks for alignment that are provided on the mask, a pixel pattern that is used to deposit the pixels are also provided on the mask. Preferably, in order to save working procedures, the alignment marks on the mask and the pixel pattern on the mask are formed simultaneously. As shown in FIG. 2, the mask 5 has a patterned region 51 and a non-patterned region 52 surrounding the patterned region. A pixel pattern 510 for depositing the pixels is provided in the patterned region.

Preferably, the first alignment marks 1 are provided in a region of the non-patterned region 52 away from the patterned region 51, and the second alignment marks 2 are provided in a region of the non-patterned region 52 adjacent to the patterned region 51.

In a specific embodiment, both the first alignment marks 1 and the second regional marks 2 may be located in a region of the non-patterned region 52 away from the patterned region 51, or may also be located in a region of the non-patterned region 52 adjacent to the patterned region 51, which will not be limited herein.

In this embodiment, providing the first alignment marks 1 and the second alignment marks 2 on different regions of the mask 5 will facilitate to improve the alignment accuracy of the mask 5 with the substrate 6. Providing the second alignment marks 2 adjacent to the patterned region 51 will facilitate to deposit the pixel pattern onto the corresponding position of the substrate 6 more precisely.

Preferably, in order to be easy to find the alignment marks by means of the image sensor and to improve the alignment efficiency, a same number of the first alignment marks 1 and the second alignment marks 2 can be provided on the mask and the respective first alignment marks 1 are symmetrically distributed on two sides of a symmetrical axis of the mask and the respective second alignment marks 2 are symmetrically distributed on two sides of a symmetrical axis of the mask.

Figure 3:
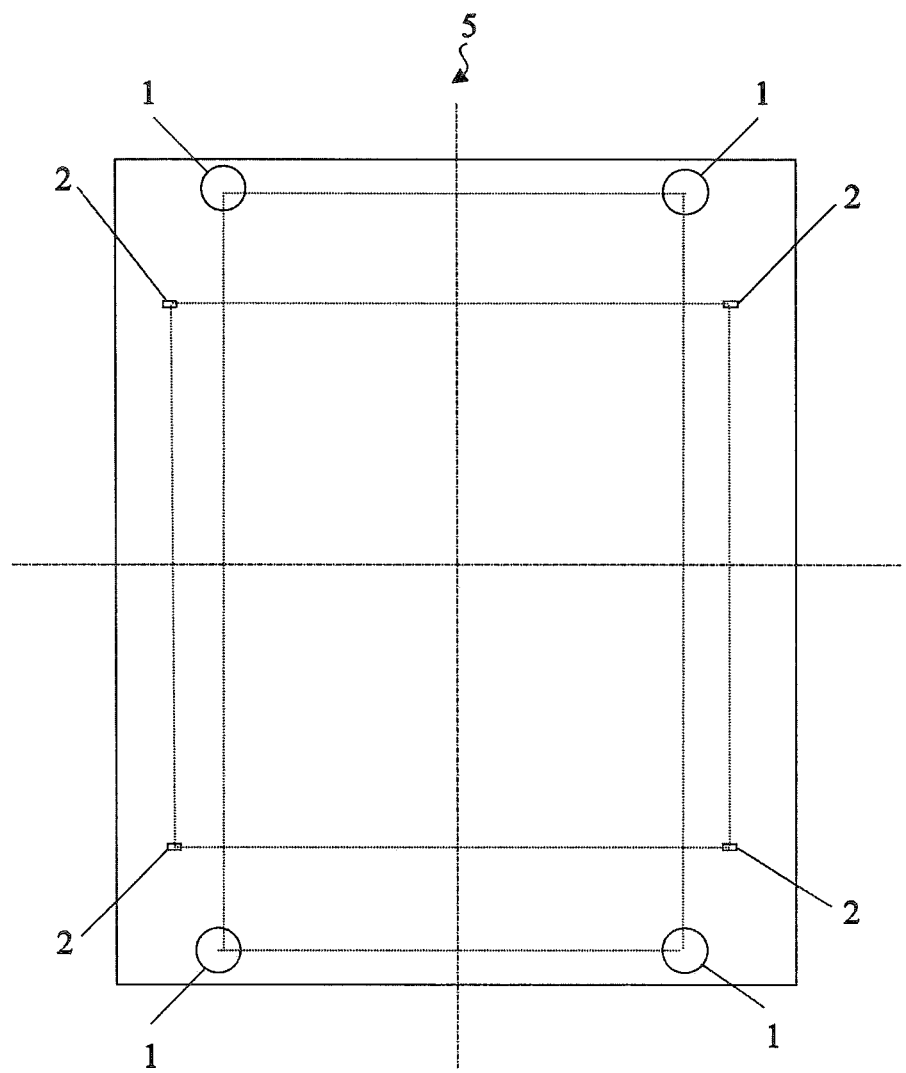
FIG. 3 is a schematic view of distribution of first alignment marks and second alignment marks provided on the mask according to the embodiment of the invention.

For example, referring to FIG. 3, there are four first alignment marks 1 and four second alignment marks 2; and symmetrical axes of a rectangle formed by successively connecting the four first alignment marks 1 coincide with symmetrical axes of the mask 5 and symmetrical axes of a rectangle formed by successively connecting the four second alignment marks 2 coincide with symmetrical axes of the mask 5.

Figure 4:
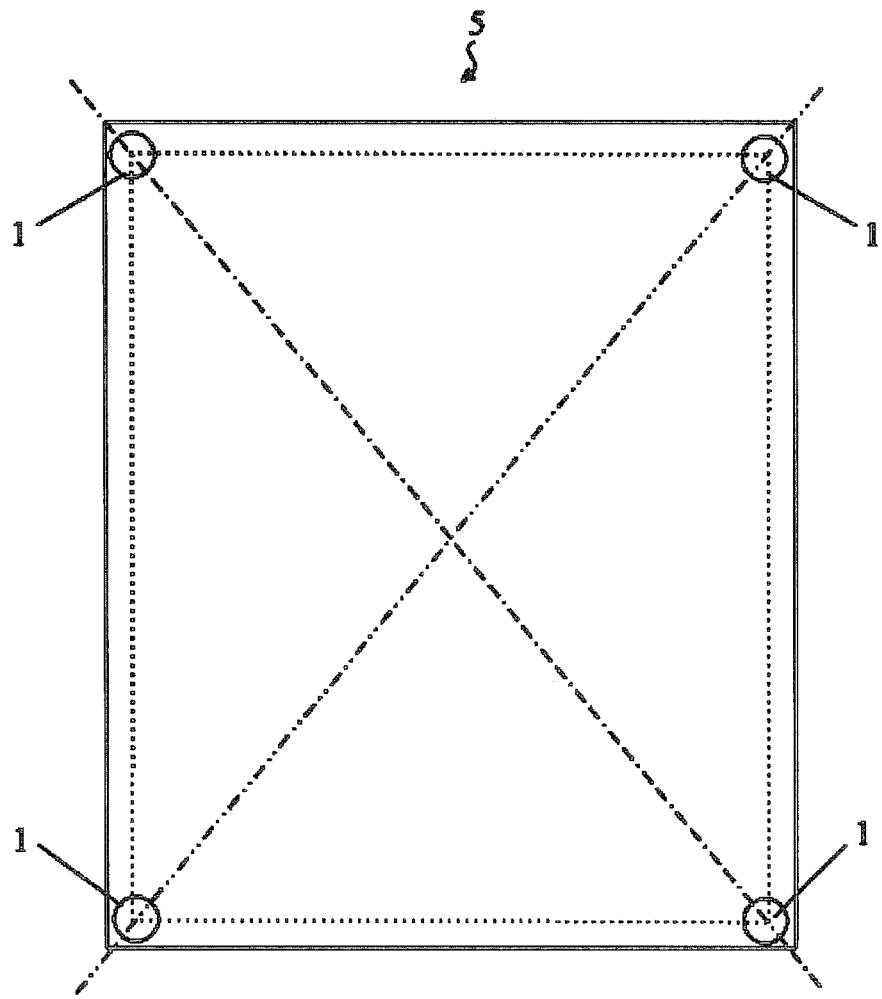
FIG. 4 is a schematic view of detailed distribution of first alignment marks provided on the mask according to the embodiment of the invention.

Preferably, referring to FIG. 4, diagonal lines of the rectangle formed by successively connecting the four first alignment marks 1 coincide with diagonal lines of the mask 5.

Preferably, in order to improve the alignment efficiency, the pattern size of the first alignment marks 1 is larger than or equal to that of the third alignment marks 3.

Preferably, a maximum width of pattern of the first alignment marks 1 is less than or equal to 0.5 mm, and a maximum width of pattern of the third alignment marks 3 is less than or equal to 0.3 mm. In the present embodiment, the maximum width of pattern of the first alignment marks 1 is less than or equal to 0.5 mm such that it is easy to find the first alignment marks 1 by means of a low power image sensor. The second alignment marks 2 are smaller than the first alignment marks 1 so that the second alignment marks 2 can be within a region surrounded by the first alignment marks 1 and so that the second alignment marks 2 are easy to be found, improving the alignment efficiency.

Preferably, the pattern size of the second alignment marks 2 is larger than or equal to that of the fourth alignment marks 4.

Preferably, a maximum width of pattern of the second alignment marks 2 is less than or equal to 2 times of width of the pixel pattern in the patterned region, and a maximum width of pattern of the fourth alignment marks 4 is less than or equal to 1.5 times of width of the pixel pattern in the patterned region. In this embodiment, the second alignment marks 2 and the fourth alignment marks 4 are configured to have an alignment pattern comparable to the pixel pattern in size, which makes it possible to achieve a high-precision alignment of the mask 5 with the substrate 6 to obtain an alignment precision during the deposition of the pixel pattern.

Preferably, the pattern size of the third alignment marks 3 is larger than that of the fourth alignment marks 4.

The first alignment marks and the third alignment marks may have same pattern shape or different pattern shapes from each other. The second alignment marks and the fourth alignment marks may have same pattern shape or different pattern shapes from each other.

Preferably, the first alignment marks 1 and the third alignment marks 3 may have same pattern shape or complementary pattern shapes to each other.

Preferably, the second alignment marks 2 and the fourth alignment marks 4 may have same pattern shape or complementary pattern shapes to each other.

Preferably, referring to FIG. 1, the pattern shape of the third alignment marks 3 and the pattern shape of the fourth alignment marks 4 are different from each other. In this embodiment, since the pattern of the third alignment marks 3 and the pattern of the fourth alignment marks 4 are different from each other, it is easy for them to be identified, thereby saving the alignment time and improving the alignment efficiency.

In this embodiment, the alignment mark structure includes the first alignment marks 1 and the second alignment marks 2 that are different in pattern size as well as the third alignment marks 3 corresponding to the first alignment marks 1 and the fourth alignment marks 4 corresponding to the second alignment marks 2. When the mask 5 and the substrate 6 are aligned with each other, the first alignment marks 1 with a larger pattern size can be firstly aligned with the third alignment marks 3 corresponding thereto to achieve an initial alignment. On the basis of the initial alignment, the second alignment marks 2 with a smaller pattern size are then aligned with the fourth alignment marks 4 corresponding thereto to achieve a precise alignment of the mask 5 with the substrate 6. Therefore, the mask 5 can be aligned with the substrate 6 in a short time and in a fast and precise manner. The efficiency of precise alignment is improved and the pixel vapor deposition process of OLED display device is simplified.

Based on the same inventive concept, an embodiment of the present invention provides a mask having a patterned region and a non-patterned region surrounding the patterned region, at least two first alignment marks and at least two second alignment marks being provided on the mask, a pattern size of the first alignment marks being larger than that of the second alignment marks, wherein the first alignment marks are configured to be firstly aligned with third alignment marks provided on a substrate, and the number and the location of the first alignment marks correspond to the number and the location of the third alignment marks, respectively; and wherein the second alignment marks are configured to be secondly aligned with fourth alignment marks provided on the substrate, and the number and the location of the second alignment marks correspond to the number and the location of the fourth alignment marks, respectively.

In specific embodiments, two, three, four or more first alignment marks may be provided on the mask and two, three, four or more second alignment marks may be provided on the mask. In particular, the plurality of first alignment marks may have same pattern shape or different pattern shapes from each other and the plurality of second alignment marks may have same pattern shape or different pattern shapes from each other. The first alignment marks and the second alignment marks may have same pattern shape or different pattern shapes from each other.

The mask provided in this embodiment will be specifically described in conjunction with FIGS. 1 and 2 hereinafter.

The mask 5 has a patterned region 51 and a non-patterned region 52 surrounding the patterned region. A pixel pattern 510 for depositing the pixels is provided in the patterned region 51. Two circular first alignment marks 1 and two rectangular second alignment marks 2 are provided on the mask 5. A pattern size of the first alignment marks 1 is larger than a pattern size of the second alignment marks 2.

The first alignment marks 1 are configured to align with the third alignment marks 3 provided on the substrate 6 during a first alignment and the number and the location of the first alignment marks 1 correspond to the number and the location of the third alignment marks 3, respectively.

The second alignment marks 2 are configured to align with the fourth alignment mark 4 provided on the substrate 6 during a second alignment, and the number and the location of the second alignment marks 2 correspond to the number and the location of the fourth alignment marks 4, respectively.

Preferably, the first alignment marks 1 are provided in a region of the non-patterned region 52 away from the patterned region 51, and the second alignment marks 2 are provided in a region of the non-patterned region 52 adjacent to the patterned region 51.

Preferably, there are four first alignment marks 1 and four second alignment marks 2; and symmetrical axes of a rectangle formed by successively connecting the four first alignment marks 1 coincide with symmetrical axes of the mask 5 and symmetrical axes of a rectangle formed by successively connecting the four second alignment marks 2 coincide with symmetrical axes of the mask 5. FIG. 3 is a schematic view of distribution of first alignment marks and second alignment marks provided on the mask.

Preferably, diagonal lines of the rectangle formed by successively connecting the four first alignment marks 1 coincide with diagonal lines of the mask 5. FIG. 4 is a schematic view of detailed distribution of first alignment marks provided on the mask.

Based on the same inventive concept, an embodiment of the present invention provides a substrate configured to be aligned with the above mask. At least two third alignment marks and at least two fourth alignment marks are provided on the substrate, the number and the location of the third alignment marks correspond to the number and the location of the first alignment marks, respectively, and the number and the location of the fourth alignment marks correspond to the number and the location of the second alignment marks, respectively.

In specific embodiments, two, three, four or more third alignment marks may be provided on the substrate and two, three, four or more fourth alignment marks may be provided on the substrate. The number of the third alignment marks provided on the substrate is equal to the number of the first alignment marks and the number of the fourth alignment marks provided on the substrate is equal to the number of the second alignment marks. Specifically, the plurality of third alignment marks may have same pattern shape or different pattern shapes from each other, and the plurality of fourth alignment marks may have same pattern shape or different pattern shapes from each other. The third alignment marks and the fourth alignment marks may have same pattern shape or different pattern shapes from each other.

A substrate according to an embodiment of the present invention will be described in the following in connection with a schematic view of the alignment mark structure provided on a mask and a substrate showing in FIG. 1.

Two circular third alignment marks 3 and two rectangular fourth alignment marks 4 provided on a substrate 6. The number and the location of the third alignment marks 3 correspond to the number and the location of the first alignment marks 1, respectively, and the number and the location of the fourth alignment marks 4 correspond to the number and the location of the second alignment marks 2, respectively.

Preferably, a pattern size of the third alignment marks 3 is larger than a pattern size of the fourth alignment marks 4.

Preferably, the pattern shape of the third alignment marks 3 and the pattern shape of the fourth alignment marks 4 are different from each other.

Preferably, the pattern size of the first alignment marks 1 is larger than or equal to that of the third alignment marks 3.

Preferably, a maximum width of pattern of the first alignment marks 1 is less than or equal to 0.5 mm, and a maximum width of pattern of the third alignment marks 3 is less than or equal to 0.3 mm Preferably, the pattern size of the second alignment marks 2 is larger than or equal to that of the fourth alignment marks 4.

Preferably, a maximum width of pattern of the second alignment marks 2 is less than or equal to 2 times of width of the pixel pattern in the patterned region, and a maximum width of pattern of the fourth alignment marks 4 is less than or equal to 1.5 times of width of the pixel pattern in the patterned region.

Figure 5:
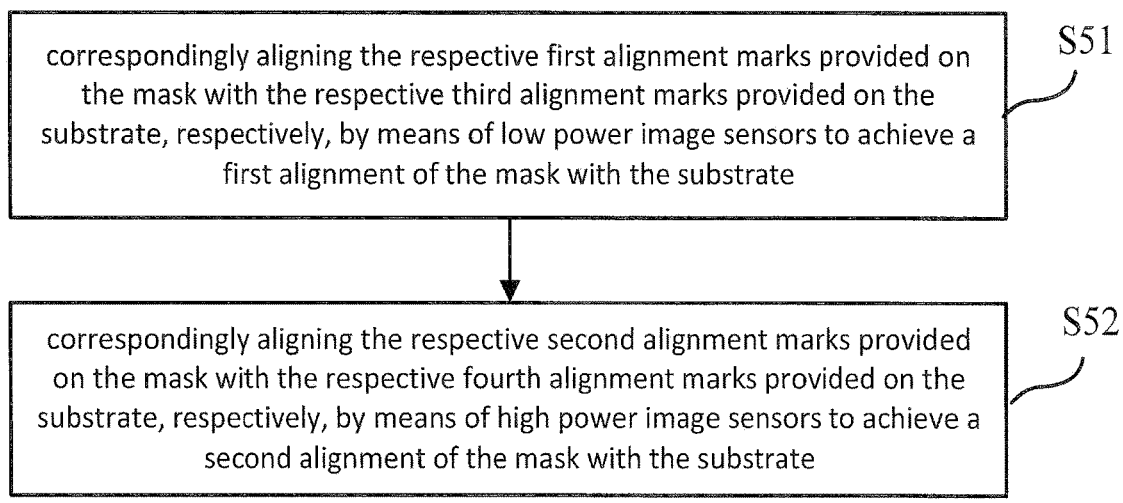
FIG. 5 is a flow chart of an alignment method for a mask and a substrate according to an embodiment of the invention.

Referring to FIG. 5, an embodiment of the present invention provides an alignment method for a mask and a substrate using the above alignment mark structure, the method including the steps of:

S51, correspondingly aligning the respective first alignment marks provided on the mask with the respective third alignment marks provided on the substrate, respectively by means of low power image sensors to achieve a first alignment of the mask with the substrate, and S52, correspondingly aligning the respective second alignment marks provided on the mask with the respective fourth alignment marks provided on the substrate, respectively by means of high power image sensors to achieve a second alignment of the mask with the substrate.

In this embodiment, the first initial alignment with low power image sensors before the following second precise alignment with high power image sensors will avoid a situation in which when high power image sensors are employed to perform a precise alignment. Since the field of view of the high power image sensors is small, it may be difficult for the high power image sensors to find the second alignment marks to perform a precise alignment. After the first initial alignment with low power image sensors, high power sensors are employed to perform a second precise alignment, which will further improve the alignment precision and enable the highly precise alignment of the mask with the substrate to achieve an alignment precision required for vapor deposition of pixel pattern.

The embodiments of the present invention have the following beneficial effects: the alignment mark structure includes the first alignment marks and the second alignment marks that are different in pattern size as well as the third alignment marks corresponding to the first alignment marks and the fourth alignment marks corresponding to the second alignment marks. When the mask and the substrate are aligned, the first alignment marks with larger pattern size can be firstly aligned with the third alignment mark corresponding thereto to achieve an initial alignment. On the basis of the initial alignment, the second alignment marks with smaller pattern size are then aligned with the fourth alignment marks corresponding thereto to achieve a precise alignment of the mask with the substrate. Therefore, the mask can be aligned with the substrate in a short time in a fast and precise manner, improving the alignment efficiency.

Obviously, those skilled in the art can make various modifications and variants without departing from the spirit and scope of the disclosure. Thus, if these modifications and variations of the present disclosure fall within the scope defined in the claims of the disclosure and its equivalents, the present disclosure is intended to encompass such modifications and variants.

What is claimed is:

1. An alignment mark structure used in a mask (5) and a substrate (6), the mask having a patterned region (51) and a non-patterned region (52) surrounding the patterned region, the alignment mark structure comprising:
    at least two first alignment marks (1) and at least two second alignment marks (2) provided on the mask, a pattern size of the first alignment marks being larger than that of the second alignment marks;
    at least two third alignment marks (3) and at least two fourth alignment marks provided on the substrate, wherein a number and a location of the third alignment marks correspond to a number and a location of the first alignment marks, respectively, such that the mask (5) and the substrate (6) are firstly aligned through a first initial alignment in which the third alignment marks and the first alignment marks are aligned,
    wherein the number and the location of the fourth alignment marks correspond to the number and the location of the second alignment marks, respectively, such that the mask (5) and the substrate (6) are secondly aligned through a second precise alignment which is more accurate than the first initial alignment and in which the fourth alignment marks and the second alignment marks are aligned, and
    wherein the at least two first alignment marks comprises four first alignment marks and the at least two second alignment marks comprises four second alignment marks; and symmetrical axes of a rectangle formed by successively connecting the four first alignment marks coincide with symmetrical axes of the mask and symmetrical axes of a rectangle formed by successively connecting the four second alignment marks coincide with symmetrical axes of the mask.

2. The alignment mark structure according to claim 1, wherein the first alignment marks are provided in a region of the non-patterned region away from the patterned region, and the second alignment marks are provided in a region of the non-patterned region adjacent to the patterned region.

3. The alignment mark structure according to claim 2, wherein diagonal lines of the rectangle formed by successively connecting the four first alignment marks coincide with diagonal lines of the mask.

4. The alignment mark structure according to claim 1, wherein the pattern size of the first alignment marks is larger than or equal to that of the third alignment marks.

5. The alignment mark structure according to claim 4, wherein a maximum width of pattern of the first alignment marks is less than or equal to 0.5 mm, and a maximum width of pattern of the third alignment marks is less than or equal to 0.3 mm.

6. The alignment mark structure according to claim 1, wherein the pattern size of the second alignment marks is larger than or equal to that of the fourth alignment marks.

7. The alignment mark structure according to claim 6, wherein a maximum width of pattern of the second alignment marks is less than or equal to 2 times of width of a pixel pattern (510) in the patterned region, and a maximum width of pattern of the fourth alignment mark is less than or equal to 1.5 times of width of the pixel pattern in the patterned region.

8. The alignment mark structure according to claim 1, wherein a pattern size of the third alignment marks is larger than that of the fourth alignment marks.

9. The alignment mark structure according to claim 1, wherein a pattern of the third alignment marks and a pattern of the fourth alignment marks are different from each other.

10. The alignment mark structure according to claim 1, wherein a pattern of the first alignment marks is in shape of any one of circle, square, rectangle, triangle or cross shape, a pattern of the second alignment marks is in shape of any one of circle, square, rectangle, triangle or cross shape, the pattern of the third alignment marks is in shape of any one of circle, square, rectangle, triangle or cross shape, and the pattern of the fourth alignment marks is in shape of any one of circle, square, rectangle, triangle or cross shape.

11. The alignment mark structure according to claim 1, wherein the first alignment marks and the third alignment marks have same pattern shape or complementary pattern shapes to each other.

12. The alignment mark structure according to claim 1, wherein the second alignment marks and the fourth alignment marks may have same pattern shape or complementary pattern shapes to each other.

13. A mask having a patterned region and a non-patterned region surrounding the patterned region, wherein at least two first alignment marks and at least two second alignment marks are provided on the mask, a pattern size of the first alignment marks is larger than that of the second alignment marks;

wherein the first alignment marks are configured to be firstly aligned with third alignment marks provided on a substrate to achieve a first initial alignment of the mask with the substrate, and a number and a location of the first alignment marks correspond to a number and a location of the third alignment marks, respectively;

wherein the second alignment marks are configured to be secondly aligned with fourth alignment marks provided on the substrate to achieve a second precise alignment of the mask with the substrate which is more accurate than the first initial alignment, and a number and a location of the second alignment marks correspond to a number and a location of the fourth alignment marks, respectively, and wherein the at least two first alignment marks comprises four first alignment marks and the at least two second alignment marks comprises four second alignment marks; and symmetrical axes of a rectangle formed by successively connecting the four first alignment marks coincide with symmetrical axes of the mask and symmetrical axes of a rectangle formed by successively connecting the four second alignment marks coincide with symmetrical axes of the mask.

14. A substrate configured to be aligned with the mask according to claim 13, wherein at least two third alignment marks and at least two fourth alignment marks are provided on the substrate, wherein the number and the location of the third alignment marks correspond to the number and the location of the first alignment marks, respectively, such that the mask (5) and the substrate (6) are firstly aligned through a first initial alignment in which the third alignment marks and the first alignment marks are aligned, wherein the number and the location of the fourth alignment marks correspond to the number and the location of the second alignment marks, respectively, such that the mask (5) and the substrate (6) are secondly aligned through a second precise alignment which is more accurate than the first initial alignment and in which the fourth alignment marks and the second alignment marks are aligned, and wherein the at least two third alignment marks comprises four third alignment marks and the at least two fourth alignment marks comprises four fourth alignment marks; and symmetrical axes of a rectangle formed by successively connecting the four third alignment marks coincide with symmetrical axes of the substrate and symmetrical axes of a rectangle formed by successively connecting the four fourth alignment marks coincide with symmetrical axes of the substrate.

15. An alignment method for a mask and a substrate using the alignment mark structure according to claim 1, wherein the method comprising the steps of:

firstly, correspondingly aligning (S51) the respective first alignment marks provided on the mask with the respective third alignment marks provided on the substrate, respectively, by means of low power image sensors to achieve a first initial alignment of the mask with the substrate, and secondly, correspondingly aligning (S52) the respective second alignment marks provided on the mask with the respective fourth alignment marks provided on the substrate, respectively, by means of high power image sensors to achieve a second precise alignment of the mask with the substrate which is more accurate than the first initial alignment, and wherein the at least two first alignment marks comprises four first alignment marks and the at least two second alignment marks comprises four second alignment marks; and symmetrical axes of a rectangle formed by successively connecting the four first alignment marks coincide with symmetrical axes of the mask and symmetrical axes of a rectangle formed by successively connecting the four second alignment marks coincide with symmetrical axes of the mask.

16. The alignment method according to claim 15, wherein the first alignment marks are provided in a region of the non-patterned region away from the patterned region, and the second alignment marks are provided in a region of the non-patterned region adjacent to the patterned region.

17. The alignment method according to claim 16, wherein diagonal lines of the rectangle formed by successively connecting the four first alignment marks coincide with diagonal lines of the mask.

18. The alignment method according to claim 15, wherein the pattern size of the first alignment marks is larger than or equal to that of the third alignment marks.

* * * * *